(12) United States Patent
Granhaug et al.

(10) Patent No.: US 9,077,326 B2
(45) Date of Patent: *Jul. 7, 2015

(54) CONTINUOUS TIME COUNTER (75) Inventors: Kristian Granhaug, Oslo (NO); Kjetil Meisal, Oslo (NO)

(73) Assignee: Novelda AS, Oslo (NO)

( * ) Notice: Subject to any disclaimer, the term of this patent is extended or adjusted under 35 U.S.C. 154(b) by 189 days.

This patent is subject to a terminal disclaimer.

(21) Appl. No.: 13/824,293

(22) PCT Filed: Sep. 20, 2011

(86) PCT No.: PCT/GB2011/051765
§ 371 (c)(1),
(2), (4) Date: Jul. 18, 2013

(87) PCT Pub. No.: WO2012/038736
PCT Pub. Date: Mar. 29, 2012

(65) Prior Publication Data
US 2013/0287151 A1    Oct. 31, 2013

(30) Foreign Application Priority Data

Sep. 20, 2010 (GB) .................................. 1015730.3

(51) Int. Cl.
| | |
|---|---|
| H03K 21/00 | (2006.01) |
| H03K 5/14 | (2014.01) |
| H03M 7/16 | (2006.01) |
| H04B 1/709 | (2011.01) |
| H04B 1/7163 | (2011.01) |
| H03K 5/22 | (2006.01) |
| H04L 7/04 | (2006.01) |

(52) U.S. Cl.
CPC .................. *H03K 5/14* (2013.01); *H03K 21/00* (2013.01); *H03M 7/165* (2013.01); *H04B 1/709* (2013.01); *H04B 1/71637* (2013.01); *H03K 5/22* (2013.01); *H04L 7/042* (2013.01)

(58) Field of Classification Search
None
See application file for complete search history.

(56) References Cited

U.S. PATENT DOCUMENTS

| | | | |
|---|---|---|---|
| 3,495,076 | A | 2/1970 | Jespers et al. |
| 4,097,801 | A | 6/1978 | Freeman et al. |
| 4,322,852 | A | 3/1982 | Barnes |
| 5,451,894 | A | 9/1995 | Guo |
| 5,953,368 | A | 9/1999 | Sanderford et al. |

(Continued)

FOREIGN PATENT DOCUMENTS

| | | |
|---|---|---|
| DE | 3339985 A1 | 5/1985 |
| EP | 0606979 A2 | 1/1994 |

(Continued)

OTHER PUBLICATIONS

Chong et al., "Potential of UWB Technology for the Next Generation Wireless Communications," 2006 IEEE Ninth International Symposium on Spread Spectrum Techniques and Applications, Aug. 2006, 8 pages.

(Continued)

*Primary Examiner* — Tuan T Lam
(74) *Attorney, Agent, or Firm* — Klarquist Sparkman, LLP (57) ABSTRACT

A continuous time counter and method of counting are provided, comprising a sequence of adding stages which build up the output based on the inputs by progressively adding new values to opposite ends of an output stack. The counter provides for fast and reliable continuous time counting operations.

12 Claims, 6 Drawing Sheets

(56) References Cited

U.S. PATENT DOCUMENTS

| | | |
|---|---|---|
| 5,953,370 A | 9/1999 | Durrant et al. |
| 6,041,092 A | 3/2000 | Tsai et al. |
| 6,100,735 A | 8/2000 | Lu |
| 6,115,113 A | 9/2000 | Flockencier |
| 6,121,808 A | 9/2000 | Gaudet |
| 6,169,438 B1 | 1/2001 | Wu et al. |
| 6,281,726 B1 | 8/2001 | Miller, Jr. |
| 6,441,657 B1 | 8/2002 | Saeki |
| 6,658,053 B1 | 12/2003 | Aiello et al. |
| 6,798,258 B2 | 9/2004 | Rieven |
| 7,026,850 B2 | 4/2006 | Atyunin et al. |
| 7,378,893 B1 | 5/2008 | Kang |
| 7,439,787 B2 | 10/2008 | Hashim et al. |
| 7,449,932 B2 | 11/2008 | Ikeda |
| 7,453,297 B1 | 11/2008 | Kaviani |
| 7,605,625 B2 | 10/2009 | Pellerano et al. |
| 7,642,831 B2 | 1/2010 | Nguyen |
| 7,746,144 B2 | 6/2010 | Jimenez et al. |
| 7,872,494 B2 | 1/2011 | Welker et al. |
| 7,893,741 B2 | 2/2011 | Cao et al. |
| 7,893,744 B2 | 2/2011 | Nakamura et al. |
| 8,248,136 B1 | 8/2012 | Zhang et al. |
| 8,461,894 B1 | 6/2013 | Zhang et al. |
| 2002/0190762 A1 | 12/2002 | Mooney et al. |
| 2002/0196061 A1 | 12/2002 | Atyunin et al. |
| 2005/0220229 A1 | 10/2005 | Goto |
| 2007/0030043 A1 | 2/2007 | Takai et al. |
| 2007/0210848 A1 | 9/2007 | Jimenez et al. |
| 2007/0248195 A1 | 10/2007 | Lerner et al. |
| 2008/0049850 A1* | 2/2008 | Sidiropoulos et al. ........ 375/257 |
| 2009/0096292 A1 | 4/2009 | Ikeda |
| 2009/0135974 A1 | 5/2009 | Mimura et al. |
| 2009/0219061 A1 | 9/2009 | Ikeda |
| 2009/0296860 A1 | 12/2009 | Chester et al. |
| 2010/0141306 A1* | 6/2010 | Doi et al. ........................ 327/117 |
| 2012/0212356 A1* | 8/2012 | Killat et al. .................... 341/110 |
| 2012/0230450 A1* | 9/2012 | Sidiropoulos et al. ........ 375/316 |
| 2013/0181746 A1 | 7/2013 | Granhaug et al. |
| 2013/0285728 A1 | 10/2013 | Granhaug et al. |
| 2013/0293275 A1 | 11/2013 | Granhaug et al. |

FOREIGN PATENT DOCUMENTS

| | | |
|---|---|---|
| EP | 0703663 A1 | 3/1996 |
| EP | 2034686 A2 | 3/2009 |
| GB | 2265029 A | 9/1993 |
| WO | WO 99/39438 A1 | 8/1999 |
| WO | WO 03/041276 A2 | 5/2003 |
| WO | WO 2006/080904 A1 | 8/2006 |
| WO | WO 2007/088211 A1 | 8/2007 |

OTHER PUBLICATIONS

Kim et al., "Fifth-Derivative Gaussian Pulse Generator for UWB System," 2005 IEEE Radio Frequency Integrated Circuits Symposium, Jun. 2005, 4 pages.

Win et al., "Comparison of Analog and Digital Impulse Radio for Wireless Multiple-Access Communications," IEEE International Conference on Communications, Montréal, Canada, Jun. 1997, 5 pages.

\* cited by examiner

CONTINUOUS TIME COUNTER

CROSS REFERENCE TO RELATED APPLICATIONS

This is the U.S. National Stage of International Application No. PCT/GB2011/051765, filed Sep. 20, 2011, which was published in English under PCT Article 21(2), which in turn claims the benefit of GB Application No. 1015730.3, filed Sep. 20, 2010.

The invention relates generally to continuous time counters, particularly for use in cross-correlators and more specifically to use in a pulse detector or symbol detector which operates in continuous time.

In Direct Sequence Spread Spectrum (DSSS) or Code Division Multiple Access (CDMA) systems, data bits are represented by various symbols (or codes), each symbol being a sequence of chips. The chip frequency (chip rate) is therefore higher than the symbol frequency (baud rate). Chip sequences can either by pseudorandom (pseudonoise) sequences or they can be specifically chosen codes (e.g. Walsh codes, Hadamard codes, Gray codes, Barker codes). By using orthogonal codes, different codes can be used to distinguish different bit sequences and/or different transmission sources (e.g. different users). By varying the length of the codes, the number of available codes can be varied.

It is vital for receivers to be able to detect incoming symbols reliably. This can be a difficult task. Current symbol detectors require accurate clock synchronisation with the transmitter in order to determine the time windows in which to look for an incoming symbol. Accurate clock synchronisation also ensures that the chip rate of the sender and receiver are closely matched which is important for accurate symbol matching. The high frequency clocks used in these symbol detectors require relatively high power which puts limitations on the size of the receivers and limits the time that such devices can operate on battery power. As this technology is central to many wireless and/or mobile communication systems, size and power consumption are important concerns.

In existing technology, a typical symbol detector takes an incoming analog signal and samples it at a high rate in order to digitize it using an Analog to Digital Converter (ADC). Subsequent processing of the digital signal is done in Digital Signal Processors (DSPs) which can store the digitized signal in memory and subsequently manipulate and/or analyse it. The DSPs require high power and also occupy significant amounts of chip area. The same applies to the clocks required for sampling and processing.

According to a first aspect, the invention provides a continuous time cross-correlator comprising: a quantizer for quantizing the incoming signal into discrete levels; a delay line comprising one or more delay units separating a plurality of delay line taps; for each of said delay line taps, a comparator for comparing the signal level of the delay line tap with a correlation value; a continuous time counter for taking the outputs of the plurality of comparators as its inputs, counting the results of the comparisons and outputting the results of the comparisons; and an output comparator for comparing the counter output with a threshold value.

This continuous time-domain counter provides a power-efficient statistical receiver which is viable for a high-speed symbol detector suitable for use in impulse radio receivers and also for pulse-detection, particularly of higher-order Gaussian pulses. The invention addresses the computational challenge of detecting noise-like (or periodic) sequences of pulses in the time domain using cross-correlation with an expected template. The invention operates in continuous time and is less computationally demanding than existing receivers which use a predominantly digital approach and therefore have significantly higher power consumption. The receiver proposed here has the further advantage of not requiring a high speed clock. Such asynchronous (clockless) operation provides another significant power saving.

By retaining the received signal in continuous time throughout the processing, rather than sampling it into discrete time, the circuit avoids the need for complex digital signal processing architecture and further avoids the need for high speed clocks. Instead of sampling the signal, the signal is passed through a delay line and multiple delayed versions of the signal are tapped off the delay line at regular intervals so that different time-domain parts of the signal are processed simultaneously. The delayed signals are passed into a continuous time counter which continuously compares each of the delayed signals with a given correlation bit. The counter thus outputs a continuous time representation of the correlation between the incoming signal and the correlation values. The delay line is an asynchronous (non-clocked) delay line.

The correlation values may be an array of values making up a bit sequence corresponding to a symbol template or to another signal (cross-correlation) or to the same incoming signal (auto-correlation). The correlation values may be static in time (as in a symbol template) or time variable (as in cross-correlation and auto-correlation).

Providing that the delays between the delay line taps match the chip rate of the transmitted bit sequence, the inputs to the counter will represent time-domain samples spaced apart by the chip rate. Therefore in the case of symbol detection for example, as a symbol in the received signal passes through the delay line, all of the counter inputs should match the template bits at the same time leading to a high count at the output of the counter representing high correlation.

The use of a continuous time counter avoids the need for digital electronics and allows the processing to be carried out at high speed and high power efficiency. Further, the counter output can easily be compared against a statistical threshold so that the level of template matching required for symbol detection can be varied. The threshold value for comparison may be a static value or it could be time-variable. The threshold value may incorporate a time element to take account of signal history. For example it could require the count to remain above a certain value for a certain period of time in order to detect correlation.

Preferably the counter comprises: a plurality of counter inputs; and a plurality of adding stages, each adding stage comprising a stack of one or more outputs, and each counter input providing an input to an adding stage, wherein the adding stages are arranged successively from a first adding stage to a last adding stage, wherein the first adding stage is arranged to set its single output to a first output value, and wherein each succeeding adding stage is arranged to take the outputs from the immediately preceding stage and if the appropriate counter input represents a count, the adding stage is arranged to add a new output at the bottom of the stack and if the counter input represents no count, the adding stage is arranged to add a new output at the top of the stack.

It will be understood that the terms "count" and "no count" are intended to represent arbitrary values such as "0" and "1", "high" and "low", "positive" and "negative", "true" and "false", etc. Systems can be set up in a variety of ways with different system attributes representing the desired values. The general principle of the counter outlined here applies to all such arrangements. It will also be appreciated that the terms "top" and "bottom" for the stack are arbitrary and are simply used to distinguish opposite ends and are not intended to be limiting on orientation.

Preferably the first adding stage has its input determined by the first counter input and if the first counter input represents a count, the first adding stage is arranged to set its single output to represent a count and wherein if the first counter input represents no count, the first adding stage is arranged to set its single output to represent no count, and in each succeeding adding stage, if the counter input represents a count, the adding stage is arranged to add a new output at the bottom of the stack representing a count, and if the counter input represents no count, the adding stage is arranged to add a new output at the top of the stack representing no count.

This counter operates by building up a thermometer code in stages. The thermometer code is made up of an array of values each taking one of two values, with the sets of values grouped together at each end of the array. At each stage one counter input is taken into account and its state is added to the thermometer count before the count is passed on to the next stage. In this way, the size of the thermometer grows as it passes through the counter, regardless of the values within it. The first stage of the thermometer therefore contains just a single value which is set according to the state of the first counter input. Succeeding stages have to make choice between adding a new input at the top of the stack or at the bottom of the stack of thermometer values. To retain the thermometer code, like values are always added at the same end. So, if the counter input represents a count (i.e. takes a value that indicates that the counter value is to increase) then a count value is added at the bottom of the stack, and if the counter input represents no count (i.e. takes a value that indicates that the counter value is to stay the same) then a no count value is added at the top of the stack. The final stage of the counter has taken into account all of the inputs and thus forms the output of the counter as a whole.

The advantages of this arrangement are that it operates in continuous time and can therefore produce high speed outputs without consuming large quantities of power. In an alternative arrangement, a first value is injected into the counter at the first stage (which holds just one value) and each subsequent stage adds further elements differing from the first value to the counter output code, thus building up the code in the same fashion as before. At each stage, the new inputs are added to the top or bottom of the stack as before, but the values added to the bottom of the stacks do not need to be the same as the first value. At each adding stage, the stack therefore contains only a single element at the first value. The height of that element within the stack depends upon the inputs and thus represents the level of correlation.

The newly added inputs at each stage of the counter may be taken directly from the corresponding counter inputs, but preferably they are provided directly from a separate source e.g. a rail in the circuit tied to the appropriate value. The inputs to the first stage may be taken directly from the counter input in most cases, but in higher frequency operations, this approach could cause problems with the instability of the inputs combined with a short decision time. Providing independent voltages (e.g. rails or hard-wired voltages) for the inputs to at least the second and subsequent stages of the counter avoids this instability and also decouples these inputs from the preceding circuitry, thus decreasing load.

Viewed from an alternative perspective, the thermometer coded counter may comprise: a plurality of counter inputs; and for each counter input, a group of one or more switching elements, each switching element in the group being controlled by said counter input and said one or more switching elements being arranged from a least significant switching element to a most significant switching element; wherein the groups are successively arranged and wherein each group comprises a plurality of inputs and a plurality of outputs, the number of inputs being one greater than the number of outputs, and wherein the plurality of inputs comprises a least significant input held at a level indicative of a count and a most significant input held at a level indicative of no count, with inputs of intervening significance being formed from the outputs of the preceding group; wherein the switching elements of each group are arranged such that when the counter input is indicative of a count, the least significant input is connected to the least significant output and the remaining inputs except the most significant input are connected to outputs of greater significance, and when the counter input is indicative of no count, the most significant input is connected to the most significant output and the remaining inputs except the least significant input are connected to outputs of lesser significance.

In each adding stage, the inputs and outputs may be connected by any type of logic, e.g. static gates (rail referred) or transmission gates (signal referred) or single devices (e.g. transformers). Preferably each adding stage comprises one or more switching elements for connecting the inputs to the outputs. The switching elements provide connections between the outputs of one stage and the inputs of the next and also provide connections for inserting the newly added inputs at each stage. The switching elements may take a variety of forms such as transistors or physical switches. In preferred embodiments the switching elements are multiplexers each arranged to connect one of two neighbouring inputs to an output or demultiplexers each arranged to connect an input to one of two neighbouring outputs. At each stage of the counter, the outputs must either be passed along to a corresponding position in the new stage or redirected up one place if a new input is being entered at the bottom of the stack. Therefore each output can be passed to one of two adjacent inputs in the next stack. Looked at the other way round, each input can be taken from one of two adjacent outputs in the previous stack (except for newly added inputs).

In small scale or lower speed applications (where the input pulses are sufficiently long), the counter will be able to function correctly with the inputs simply being taken directly from the delayed signal streams. However in large and/or fast applications, the counter is preferably arranged to apply a delay to each of its inputs to compensate for the propagation delay through the adding stages. In a large counter with short input pulses, the propagation delay for the first counter signal may exceed the input pulse length. As all of the stages operate in parallel according to their individual input streams, this could result in false counts and missed symbols. The compensation delay may be added as part of the counter circuitry or it may be added elsewhere in the detector circuit, e.g. by incorporating it into the delays in the delay line. The compensation delay may be provided on separate delay elements for each stage. Alternatively, as the inherent delay associated with the switching elements can be varied by design, the components of the counter may be designed to have an appropriately compensated delay.

The delay units of the delay line may be set and calibrated within the factory. However this is difficult due to process variations, especially for longer delay units. Therefore preferably the delay units of the delay line are tunable. Tunable delay elements allow the delay line to be accurately calibrated to a given chip rate. If the detector is part of a device which is designed for operation at a single specific chip rate, then the delay units can be tuned and calibrated once at the start of the product's life. This saves further chip area by avoiding the need for further calibration elements. However, it is preferred that the delay line be tunable in the field, e.g. to recalibrate the device when it drifts (e.g. due to temperature or humidity variations) or to recalibrate for a different chip rate.

Tunable delay elements are normally created from circuit elements which have a slow response time. These circuits can be tuned by varying certain components of the delay circuit to increase or decrease the delay. However these circuits have an unreliable output and accurate delay calibration is very difficult. Power consumption is also not efficient. Preferably therefore each delay unit comprises a plurality of first delay elements and a plurality of first delay element taps between the first delay elements, wherein the first delay element taps are inputs to a first multiplexer and wherein the output of the first multiplexer is selected from among the inputs according to a first tap select input. In this way, the amount of delay provided by each delay unit can be tuned by selecting how many delay elements within the delay unit are involved in the path between the input and the output of the delay unit. Further each delay unit is easily tuned simply by varying the tap select input. All of this circuitry can be made from simple, low-power circuit elements such as inverters and multiplexers. Further, as the shortest delay element can be made from two inverters in series with a total delay of around 20-30 ps (dependent on process), each delay unit can be tuned to within a very high accuracy. This is particularly important for detecting high frequency pulse sequences. The delay elements are preferably non-clocked (asynchronous) delay elements.

The above arrangement can provide very high accuracy delay tuning. However, for long delays the number of delay elements would become impractical if using the shortest delay elements possible. Therefore the tunable delay elements preferably use a two stage coarse/fine delay tuning arrangement. Each delay unit preferably further comprises a plurality of second delay elements connected in series to the output of the first multiplexer and a plurality of second delay element taps between the second delay elements, wherein the second delay element taps are inputs to a second multiplexer and wherein the output of the second multiplexer is selected from among the inputs according to a second tap select input. The second delay elements preferably provide shorter delays than the first delay elements. The first delay elements can be arranged with longer durations so that fewer elements are required to make up the desired longer delay. The number of these longer delay elements can still be varied to provide coarse tuning. Fine tuning can then be provided by means of the second, shorter delay elements which add extra delay onto the coarse setting in fine increments until the desired delay setting is achieved.

With the above tuning arrangements, the delay units of the delay line may be calibrated in a number of different ways. In some preferred embodiments a reference delay unit is provided for calibrating the delay units of the delay line.

The reference delay unit may simply be a circuit element with a well-known and/or predetermined delay time which can be used for comparison with the tunable element which is undergoing tuning. However preferably the reference delay unit comprises a plurality of reference delay elements and a plurality of reference delay element taps between the reference delay elements, wherein the reference delay element taps are inputs to a reference multiplexer and wherein the output of the reference multiplexer is selected from among the inputs according to a reference tap select. With this arrangement the reference delay element can provide a variable output, i.e. a number of different reference delays, according to the given reference tap select. This arrangement is useful when adjusting the detector for receiving a different chip rate. Preferably the detector further comprises a comparator arranged to compare the output of the reference delay unit with the output of one or more of the delay line delay units.

The above tuning/calibration scheme allows for absolute calibration of the delay units. However this is not always required. In other situations it is sufficient to use relative tuning, i.e. tuning the delay line relative to itself, e.g. simply to ensure that all delay line taps are equally spaced. Relative tuning can of course be used together with absolute tuning, e.g. by tuning one element absolutely and then tuning the remaining elements relative to the tuned element. Preferably therefore the detector further comprises a comparator arranged to compare the output of one delay line delay unit with at least one other delay line delay unit.

According to a further aspect, the invention provides a method of detecting a pulse sequence in an incoming signal in continuous time, comprising: quantizing the incoming signal into discrete levels; generating a plurality of delayed versions of the incoming signal; comparing each of said delayed signals with a stored correlation value; counting the results of the comparison in a continuous time counter; and comparing the counter output with a threshold value.

The preferred features described above in relation to the apparatus also apply equally to the method.

Preferably therefore the step of counting comprises: taking a plurality of counter inputs; providing a plurality of adding stages each comprising a stack of one or more outputs, each counter input providing an input to an adding stage, wherein the adding stages are arranged successively from a first adding stage to a last adding stage; setting the single output of the first adding stage to an output value; and for each succeeding adding stage, taking the outputs from the immediately preceding stage and if the appropriate counter input represents a count, adding a new output at the bottom of the stack and if the counter input represents no count, adding a new output at the top of the stack.

Preferably the first adding stage takes its input from the first counter input and if the first counter input represents a count, the first adding stage is arranged to set its single output to represent a count and wherein if the first counter input represents no count, the first adding stage is arranged to set its single output to represent no count, and in each succeeding adding stage, if the counter input represents a count, the adding stage is arranged to add a new output at the bottom of the stack representing a count, and if the counter input represents no count, the adding stage is arranged to add a new output at the top of the stack representing no count.

Each adding stage may comprise one or more switching elements connecting the inputs to the outputs. The switching elements may be multiplexers each connecting one of two neighbouring inputs to an output. The switching elements may be demultiplexers each connecting an input to one of two neighbouring outputs. The counter may apply a delay to each of its inputs to compensate for the propagation delay through the adding stages.

The method may further comprise tuning the delays applied to the received signal by passing the received signal through tunable delay units. Each delay unit may comprise a plurality of first delay elements and a plurality of first delay element taps between the first delay elements, and the method may further comprise tuning at least one delay unit by selecting one of the first delay element taps as the output of the delay unit.

Each delay unit may further comprise a plurality of second delay elements connected to the selected output of the plurality of first delay elements and a plurality of second delay element taps between the second delay elements, and the step of tuning may comprise selecting one of the second delay element taps as the output of the delay unit. Preferably the second delay elements provide shorter delays than the first delay elements.

The method may further comprise calibrating at least one delay units against a reference delay unit. The reference delay unit may comprise a plurality of reference delay elements and a plurality of reference delay element taps between the reference delay elements, and tuning the delay unit against the reference delay unit may comprise selecting a reference delay element tap and tuning the delay unit to match the delay given by the selected reference delay element tap.

The method may further comprise comparing the output of the reference delay unit with the output of one or more of the delay units.

The step of tuning may comprise tuning the output of one delay unit to that of at least one other delay unit.

The tunable delay line described above is believed to be independently inventive. Therefore according to a further aspect, the invention provides a tunable delay line comprising one or more delay units and one or more delay line taps; wherein each delay unit comprises a plurality of first delay elements and a plurality of first delay element taps between the first delay elements, wherein the first delay element taps are inputs to a first multiplexer and wherein the output of the first multiplexer is selected from among the inputs according to a first tap select input.

According to another aspect, the invention provides a method of tuning a tunable delay line, the delay line comprising one or more delay units and one or more delay line taps and each delay unit comprising a first plurality of delay elements and a first plurality of delay element taps between the first delay elements, the method comprising selecting one of the first delay element taps as the output of the delay unit.

The preferred features of the tunable delay line described above in relation to the symbol detector and method apply equally to the tunable delay line on its own.

The above described thermometer coded counter is also believed to be independently inventive. Therefore according to a further aspect, the invention provides a continuous time counter comprising: a plurality of counter inputs; and a plurality of adding stages, each adding stage comprising a stack of one or more outputs, and each counter input providing an input to an adding stage, wherein the adding stages are arranged successively from a first adding stage to a last adding stage, wherein the first adding stage is arranged to set its single output to a first output value, and wherein each succeeding adding stage is arranged to take the outputs from the immediately preceding stage and if the appropriate counter input represents a count, the adding stage is arranged to add a new output at the bottom of the stack and if the counter input represents no count, the adding stage is arranged to add a new output at the top of the stack.

According to another aspect, the invention provides a method of continuous time counting comprising: taking a plurality of counter inputs; providing a plurality of adding stages each comprising a stack of one or more outputs, each counter input providing an input to an adding stage, wherein the adding stages are arranged successively from a first adding stage to a last adding stage; setting the single output of the first adding stage to an output value; and for each succeeding adding stage, taking the outputs from the immediately preceding stage and if the appropriate counter input represents a count, adding a new output at the bottom of the stack and if the counter input represents no count, adding a new output at the top of the stack.

Preferably the first adding stage takes its input from the first counter input and if the first counter input represents a count, the first adding stage sets its single output to represent a count and wherein if the first counter input represents no count, the first adding stage sets its single output to represent no count, and in each succeeding adding stage, if the counter input represents a count, the adding stage adds a new output at the bottom of the stack representing a count, and if the counter input represents no count, the adding stage adds a new output at the top of the stack representing no count.

The preferred features of the counter described above in relation to the symbol detector and method apply equally well to the counter taken on its own.

Preferred embodiments of the invention will now be described by way of example only and with reference to the accompanying drawings in which.

Figure 1:
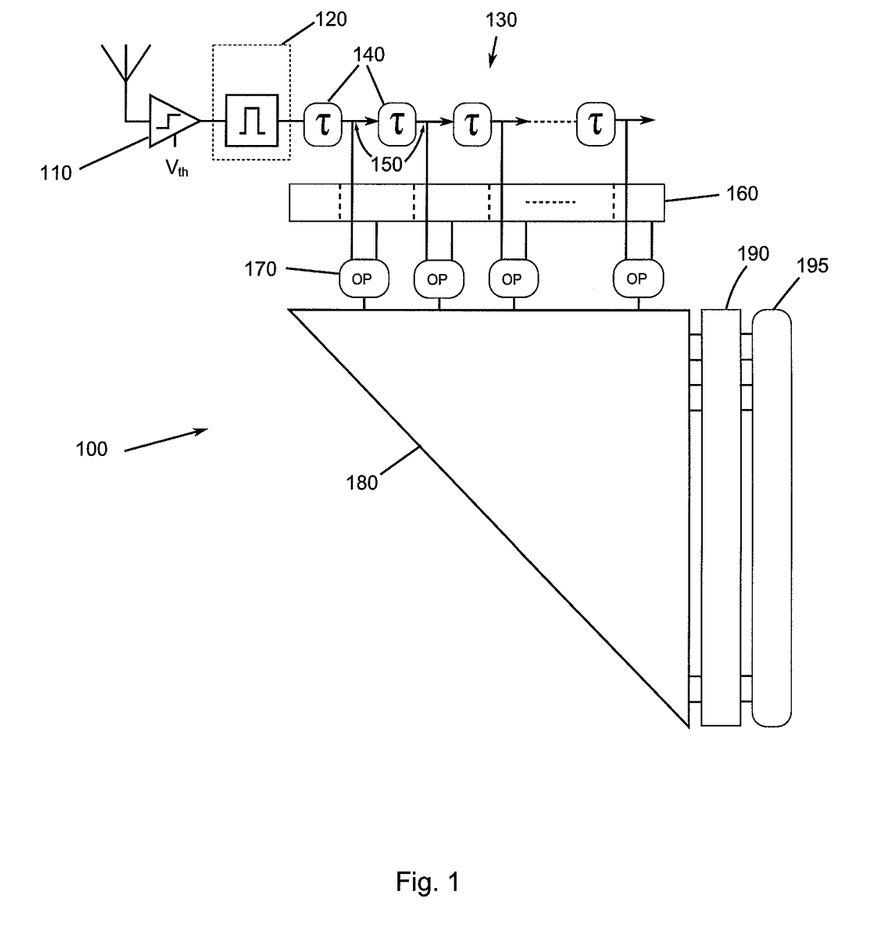
FIG. 1 schematically shows a continuous time binary value (CTBV) cross-correlator according to a first embodiment of the invention.

As shown in FIG. 1 the Continuous Time Binary Value (CTBV) cross-correlator 100 is based on a single bit or binary quantization of the incoming signal. The quantizer 110 may be a comparator based solution or it may be a zero-level quantizer giving the sign of the incoming signal (i.e. sign(S)). It should be noted that, although the embodiments described herein are in relation to binary quantization, the circuit can easily be adapted for a multi-level system, e.g. a 3-level (ternary) quantizer and comparators.

A pulse extender 120 is shown in FIG. 1, although as indicated this is an optional feature. The pulse extender 120 can facilitate processing as each detected pulse may be extended to a suitable width depending on the transmission center frequency or the period of the sequence. As the quantizer 110 is not clock-based, the pulse length is simply the time that the incoming signal spends above the quantizer threshold. In some instances this could be too short for reliable comparisons to be made later in the circuit so the pulse extender 120 is used to ensure a minimum pulse length.

For cross-correlation template matching (e.g. in a symbol detector) the incoming sequence of bits is stored in a delay-line 130 made up of delay units 140 with suitable delays matching the expected period of the transmitted pattern (i.e. the expected chip rate). By tapping the delay line at equally spaced points 150 corresponding to the expected period, it is possible to continuously process the incoming sequence of bits looking for the desired pattern. The delay units 140 are also asynchronous units (not clock-based).

The unit delays 140 between taps 150 make up a discrete, temporal (time-domain) pattern of the incoming signal suitable for cross-correlation with a binary template 160. Importantly, it can be observed that the delay line may give dense samples. For example, if a double inverter structure is used for the unit delay 140, it is possible to achieve delays of the order of only 20 ps (equivalent to a sampling rate of 50 GHz). Quite long unit delays 140 may also be constructed of the order of tens of nanoseconds, but due to production variation, calibration may be required. These long-delay correlators are particularly suitable for power efficient symbol detection, e.g. in impulse radio communication. Shorter delay correlators are particularly well suited to high frequency (e.g. Ultra Wide Band) pulse detection.

FIG. 1 shows a template register 160 in which the bit sequence of an expected symbol may be stored. It will be appreciated that in other embodiments this register may be static or time variable, e.g. it may represent a time dependent bitstream from another signal for cross-correlation or from the same signal for auto-correlation. For example, it may represent a time-delayed version of the input signal.

As indicated above, in this embodiment the template register 160 is simply a binary sequence. Depending on the coding strategy used, not all template bits may be part of the code. For example, if the coding strategy involves pseudo-noise patterns with sparse filling, the logical operation 170 (OP in FIG. 1) could be an AND operation. This arrangement looks for matches of positive, '1' values but ignores the correlation of '0' values. Alternatively, for codes with all chips filled (like biphasic codes), the detector might match for both '0' and '1' and could use XOR as the operation 170. In general the required combinatorial logic function greatly depends on the coding scheme being used.

The outputs of the operation 170 are fed into continuous time counter 180 which outputs a thermometer coded output 190. The thermometer coded output 190 is passed to a comparator 195 which compares the counter output to a threshold value. It will be appreciated that the counter 180 may generate its output in a form other than a thermometer code, e.g. it may be a floating value output as described elsewhere, or it may be any other appropriate format.

A CTBV pulse counter 200 may be designed as shown in FIG. 2. The cross-correlation result is a set of bits with '1' indicating correlation match. The number of '1's appearing at the OP 170 outputs gives the instantaneous cross-correlation between the incoming bitstream and the template 160.

By controlling the switches 205 with the OP outputs 170, the counter can "steer" '0's and '1's, thus giving a continuous measure (count) of the template match as a stack of '1's on the output. This output coding is known as thermometer coding with higher "temperature" (i.e. greater stack of '1's) indicating better match. Simple combinatorial logic may be used to determine the matching level, e.g. by comparing to a threshold level 210. The threshold may be an array of values with a '1' placed at the appropriate height (array location) for the acceptable match level, e.g. if at least three bits in the input stream must be matched then a '1' is placed in the third array element (see FIGS. 2C and 2D). It will be appreciated that this arrangement is highly implementation dependent. In this way, the symbol detector can detect symbols probabilistically, e.g. when a threshold number of matches have been made (this need not correspond to a perfect match). In one embodiment, the switches 205 are made as multiplexers in MOS technology. Other forms of switch 205 may also be used and will depend on the purpose for which the counter is being used. For example transistors (bipolar or FETs) could be used. Equally, physical switches such as relays could be used in large scale applications. For larger systems (e.g. with a large number of counter stages), and especially in high frequency applications, the propagation delay through the switching network must be compensated for. This can be done in a number of ways. One way is to introduce delay elements into the path of the counter inputs, e.g. a series of inverters. Alternatively, the comparators used to compare the incoming signal with the template elements (correlation values) can be slowed down or speeded up by varying the strengths of the transistors used therein. Another way of compensating for the propagation delay is to use one or more pulse extenders 120 to extend the incoming chips so that they are long enough to accommodate the longest propagation delay through the counter 200. In other words the switches 205 in the last counter input must remain in their correct positions long enough for the signal from the first counter input (and all intervening inputs) to propagate through all counter stages and reach the output. Alternatively, the compensation delay may be built into the switches of the counter, these elements being designed to have an appropriate delay according to their location within the circuit. Combinations of these techniques may be used to compensate for the propagation delay.

Figure 2A:
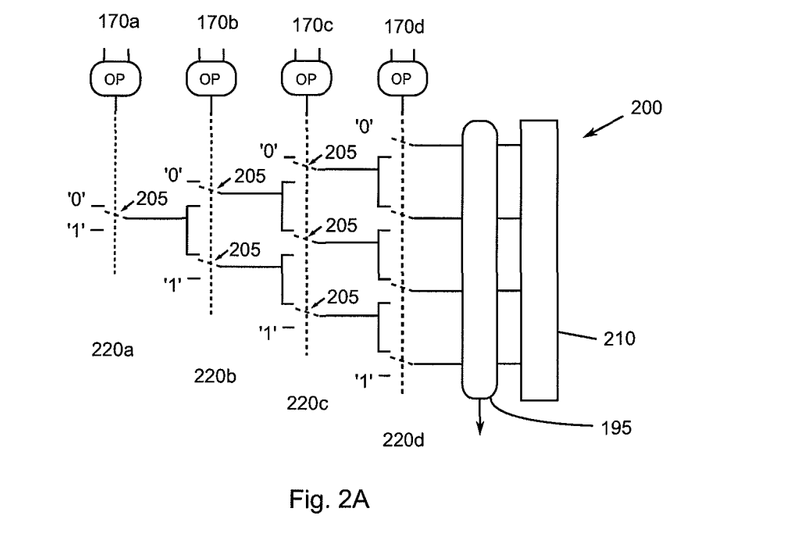
FIGS. 2A and 2B schematically show CTBV counters according to embodiments of the invention.

To describe the operation of the counter 200 in more detail, the counter 200 is made up of a number of stages 220*a-d*, one for each of the OP 170 outputs (i.e. one for each template bit). The first stage 220*a* simply introduces a '1' or a '0' according to the result of the first comparator 170*a*. Each subsequent stage 220*b-d* adds the result of its comparator 170*b-d* to the result of the previous stage. In order to preserve the thermometer coding within each stage, if the stage is adding a '1' bit (e.g. for a successful comparison), this is added at the bottom of the stack and if the stage is adding a '0' bit (e.g. for an unsuccessful comparison), this is added at the top of the stack. All elements of the previous stage's stack maintain their order. In this way, all the '1's are inserted into the bottom of the stack and are thereby kept together. All remaining positions in the stack are made up of '0's inserted from the top. The final stage output 220*d* is the full thermometer coded count and becomes the output of the counter 200. The number of '1's in the stack (and therefore the height of the '1's in the thermometer) represents the count of the number of '1's in the inputs. In the cross-correlator of FIG. 1, this represents the extent of the correlation between the incoming signal and the template register.

Figure 2B:
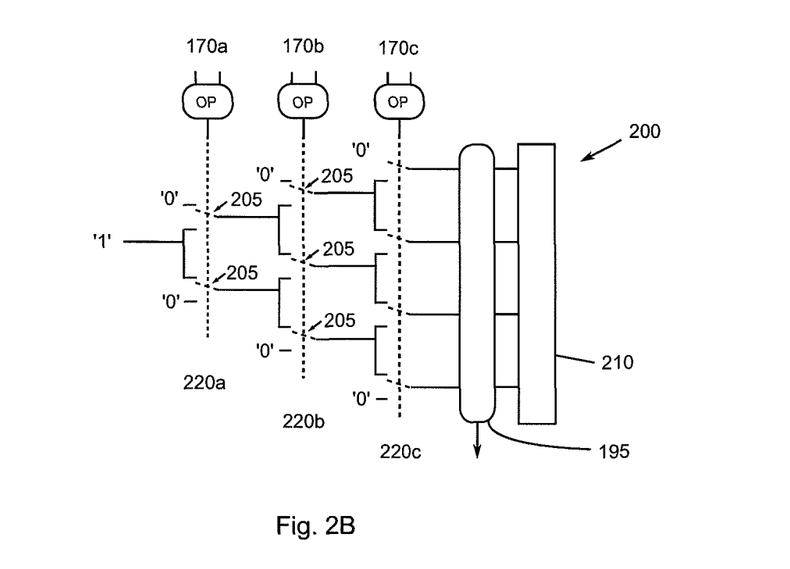
Figure 2C:
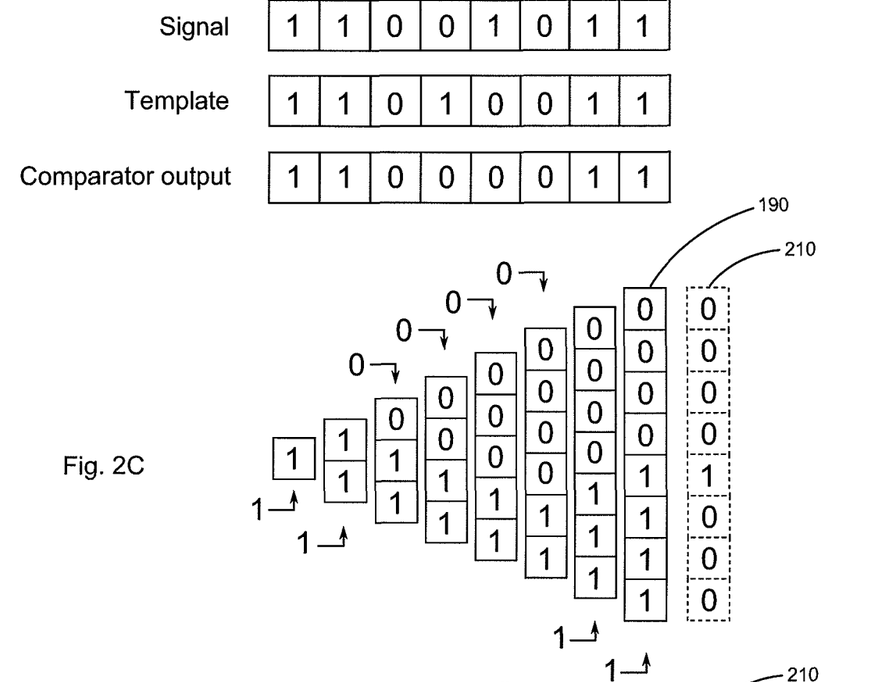
FIGS. 2C and 2D illustrate the values in the adding stages of the counters of FIGS. 2A and 2B respectively.

This operation is illustrated in FIG. 2C. At the top of the Figure, the quantized values of the incoming signal are shown along with bit values of a stored template and the results of the comparator which combines the signal and template values (in this case using an AND operation). Underneath these values and in line therewith, the adding stages are shown. At the left hand side, the first adding stage is set with a single '1' value as the comparator output is '1'. In the second stage (one stage to the right), the second comparator result has been added in at the bottom of the stack. In the third stage (one stage further to the right) a third stack value of '0' is added at the top of the stack. The process repeats until the eighth stage shows a stack of four '1's on the bottom and four '0's on the top. These values correspond to the four '1's and four '0's shown in the comparator output at the top, but rearranged into a thermometer code.

Finally, the dashed box at the end of FIG. 2C represents a threshold value. A '1' has been set in the fourth box of the array to indicate that a symbol will be detected upon counting four successful matches. As can be seen, the template for the expected signal actually contains five '1's and the incoming signal did not match one of those '1's, but the match of four '1's is considered sufficient to indicate that the incoming signal was intended to contain the correct symbol pattern.

Figure 2D:
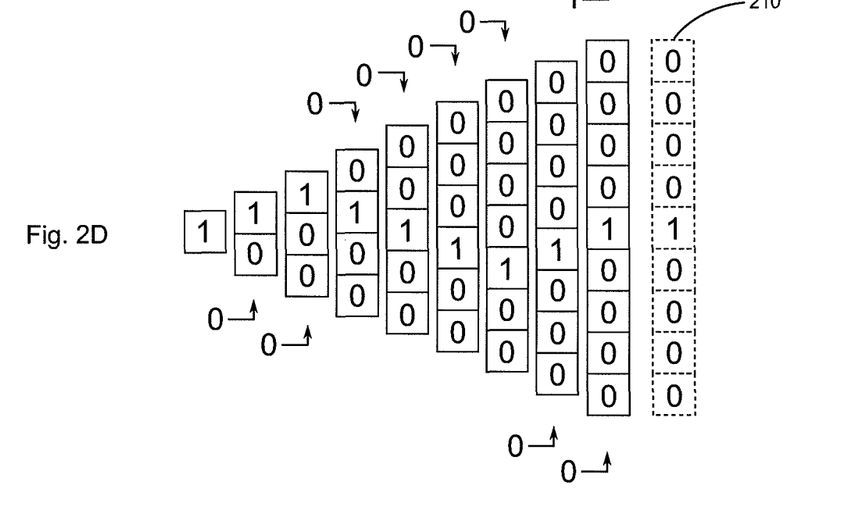

An alternative arrangement of the counter is illustrated in FIG. 2B. In this figure, a '1' is inserted at the left hand end, regardless of the counter inputs. The adding stages then add '0's either on above or below the '1' according to the counter inputs, thus causing the '1' to float at a certain height within the adding stage. The height at which it floats is determined by the number of successful matches, i.e. the number of '0's added into the bottom of the stack. FIG. 2D illustrates the values within the adding stages in corresponding fashion to that of FIG. 2C. It will be seen that FIG. 2D contains nine vertical arrays as the first array simply injects the first '1' and is not dependent on a counter input.

Two particular applications of the CTBV counter 200 will now be described, although it will be appreciated that the counter is not limited to these applications.

EXAMPLE APPLICATION 1

Higher-Order Gaussian Pulse Detector

One particularly challenging task which is solved by the CTBV counter 200 is pulse discrimination for impulse radio. Although different pulse shapes may be used, a popular pulse shape is an approximation to a Gaussian shaped pulse or Gaussian-derivative shaped pulse. Gaussian and Gaussian-derivative pulses have good spectral filling properties and are therefore useful in the unlicensed UWB bands. In the USA the FCC permits unlicensed transmission at powers below −41.3 dBm/MHz between 3.1 and 10.6 GHz. In Europe, the band is narrower at 6-8.5 GHz. As regulations (especially outside the USA) are limiting the unlicensed UWB bands, higher order Gaussians (higher order derivatives) are required in order to fill the permitted spectrum.

Figure 3:
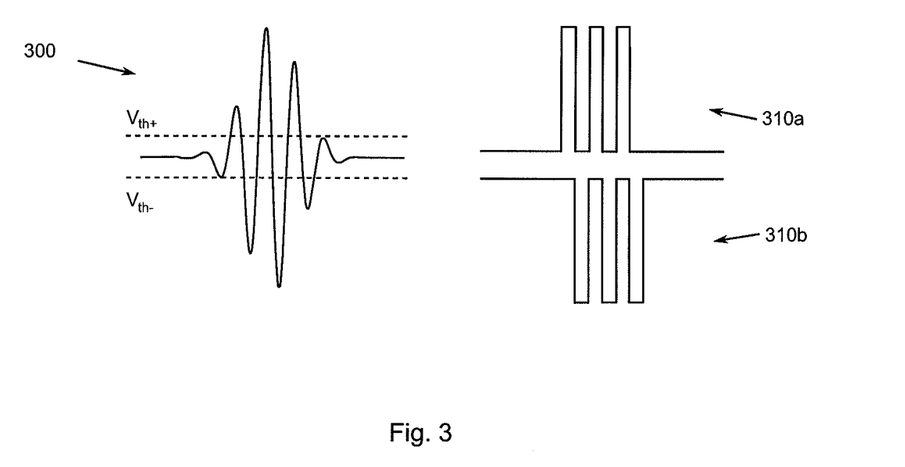
FIG. 3 shows a high-order Gaussian pulse and a corresponding detector output.

FIG. 3 shows a typical Gaussian-derivative pulse shape 300 shown together with the quantized output 310 using two different threshold voltage levels. By using two CTBV counters 200, both the positive 310a and negative 310b pulses may be counted. The unit-delay of the CTBV counter is adapted to the center frequency of the transmitted signal. By detecting and counting the received pulses, the detector can readily discriminate between received pulses and background noise. As described above, the detection results of two counters (for counting both positive and negative peaks) may be combined for improved time-domain pulse discrimination. On the other hand, a single counter (for counting just positive or negative peaks) may be used if that provides adequate discrimination. By adapting the threshold voltages of the quantizer and setting the number of detectable peaks in the template register 160, good pulse discrimination can be achieved. The continuous time, non-clocked processing of the counter 200 allows pulse detection to be performed at high frequency and with good power efficiency.

EXAMPLE APPLICATION 2

CTBV Symbol Detector

The second example application of the CTBV counter 200 is for symbol detection in pulsed radio communication (e.g. in impulse radar or in wireless communication systems). The unit-delay of the CTBV-counter 200 is tuned to the chip length (i.e. the time duration of one chip) of the PN-coded symbol (which is often of the order of tens of nanoseconds). By setting the appropriate bit-sequence (i.e. the sequence of chips which form the symbol) in the template register 160, a running cross-correlation is computed. By using appropriate detection logic on the counter output 220d, symbol detection is feasible. It should be noted that no clock-synchronization is required between transmitter and receiver because all processing is carried out in continuous time. However, relative chip-clock accuracy in the transmitter is important since the delay line taps 150 are calibrated to the transmitted chip clock frequency. Deviations between the transmitter chip clock and the delay line taps 150 may lead to degraded symbol detection, e.g. symbols being missed. Some leeway is given by using the pulse extender 120 shown in FIG. 1. By extending the pulses, small timing inaccuracies can be accommodated while still ensuring that sufficient temporal overlap occurs within the counter for an accurate correlation to be produced. It should be noted that clock inaccuracy is also important within the duration of one symbol. With current crystal quality, few problems should occur for short symbols, but care needs to be taken for longer symbols.

For longer counting operations (a large number of inputs), the inputs may be grouped together and the groups passed to separate counters 200 for parallel counting before combining the results. Alternatively, the adding stages 220a-d of the counter 200 may be grouped together and the interim counter results can be latched or stored for use in the subsequent adding stages 220a-d while the previous adding stages 220a-d can be reused for the next counting operation. This arrangement allows pipelining of the counter.

The significant variations in production spread of modern technology directly map to variations in gate delays. In the CTBV solutions described herein, clocking is avoided. Instead, these solutions explore inherent gate delays in delay lines. It is therefore important to account for these major variations in gate delays. The invention therefore provides programmable delay units which can be adjusted to provide a varying delay and can therefore be accurately calibrated to a selected desired delay.

Figure 4:
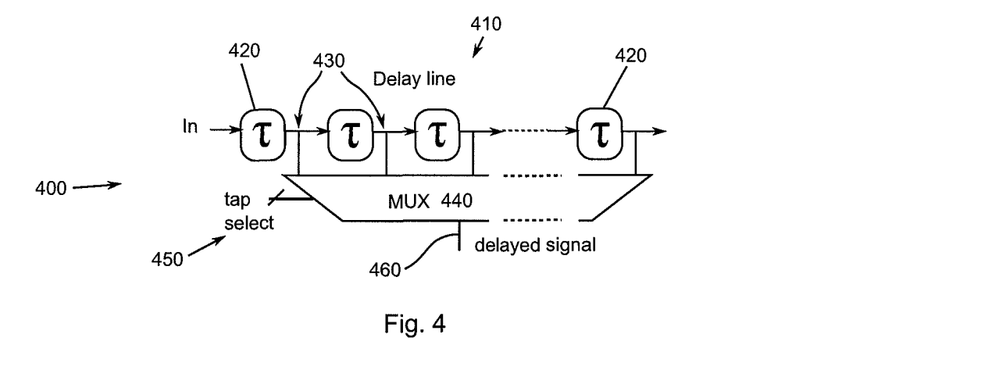
FIG. 4 shows a programmable delay element according to embodiments of the invention.

In FIG. 4 a programmable delay unit 400 is shown. The delay unit 400 is itself formed from a delay line 410 of shorter delay elements 420. Delay line taps 430 are taken from between the shorter delay elements 420 and these taps 430 form the inputs to a multiplexer 440. The multiplexer 440 is controlled by a tap select input 450 which selects which one of the multiplexer inputs 430 is to be passed to the multiplexer output 460. In this way, by varying the tap select input 450 to the multiplexer 440, the number of shorter delay elements 420 in the delay unit 400 can be varied, thus varying the overall delay of the delay unit 400.

The simplest and smallest delay element can be formed from two digital inverters connected in series. In a typical nanometer process, two cascaded inverters will provide a minimum time delay, $\tau_{min}$ of the order of 20-30 ps, although this figure is somewhat dependant on the quality of the layout. Although there is some spread in this minimum delay, the precision is still sufficient for calibration of longer delays such as 1 ns or longer.

Calibration can be performed in different ways. It is convenient to distinguish between absolute calibration requiring an external timing reference to which the delay unit 400 is to be matched and relative calibration requiring matching of two on-chip delays (i.e. matching one on-chip delay unit to another on-chip delay unit). This relative calibration may be done by matching delay line delay units to a separate pre-calibrated on-chip reference delay unit or it may involve self-tuning of the delay line by tuning the delay line delay units to each other in order to provide a consistent time separation of the taps.

Figure 5:
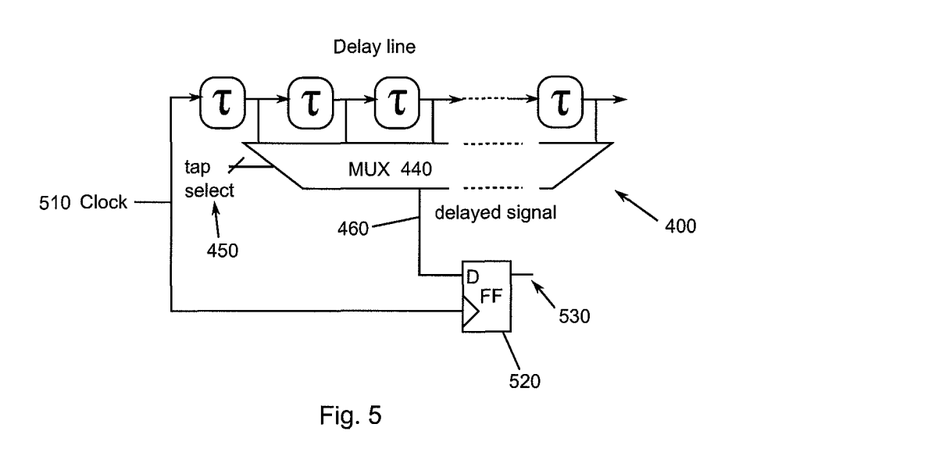
FIG. 5 shows an arrangement for setting the delay adjustment of the delay element of FIG. 4.

A delay unit 400 may be calibrated to an external clock signal 510 by using an edge triggered D flip flop 520. The non-delayed clock drives the flip flop 520 (via the enable input) to sample the delayed output 460 from the multiplexer 440. Using a positive edge triggered D flip flop 520, if the flip flop output 530 is high this indicates that the output 460 of the multiplexer 440 went high earlier than the clock 510 and the tap select 450 should be changed to increase the delay until the flip flop output 530 goes low. On the other hand, if the flip flop output 530 is low this indicates that the output 460 of the multiplexer 440 went high later than the clock 510 and the tap select 450 should be changed to decrease the delay until the flip flop output 530 goes high. An iterative search for the clock edge can be performed.

Figure 6:
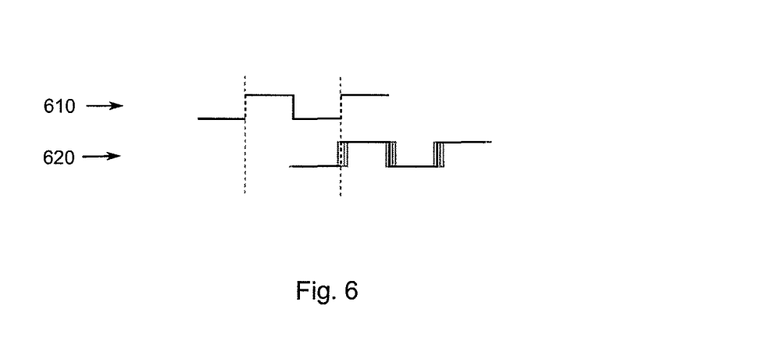
FIG. 6 illustrates delay matching against a clock signal.

This arrangement is shown in FIG. 5 and the adjustment procedure is illustrated in FIG. 6 which shows the clock signal 610 against the adjustable delay signal 620 for various delays (i.e. for various tap selects).

If a good quality clock is used, both the negative (half-period) and positive (full-period) of the multiplexer output 460 may be sampled. This can be done either by introducing logic to select whether the rising edge or falling edge is sampled or two separate flip flops can be employed one for sampling on the rising edge and one on the falling edge. Sharp clock transitions (good quality clock) reduce clock jitter and sampling on both rising and falling edges allows double the number of calibration measures, thereby providing more accurate calibration. Also, by sampling half periods, a higher frequency calibration can be performed without introducing a higher frequency clock.

Each delay unit of a delay line (e.g. the delay line 130 of FIG. 1) can be tuned or calibrated in this way, with a tap select 450 being identified for each delay unit so as to create a tap-select pattern for the delay line as a whole. The tap-select pattern after this calibration procedure achieves an absolute matching to within the resolution of the minimum delay time, $\tau_{min}$, i.e. of the order of 20-30 ps for a sub 100 nm process.

Figure 7:
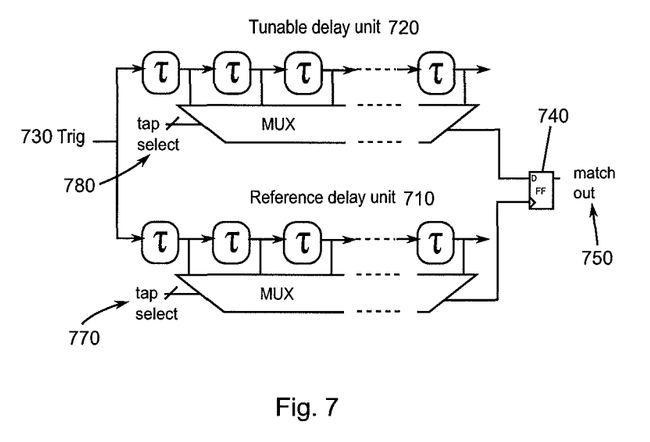
FIG. 7 illustrates delay matching against a reference delay unit.

A relative calibration may also be done using a D flip-flop. An appropriate set up is shown in FIG. 7. In this procedure, a calibrated delay unit (Reference delay unit 710) is used in place of the clock reference. The calibrated delay unit 710 may be either an on-chip pre-calibrated delay unit (e.g. calibrated in the factory) or it may be another delay unit in the delay line of the main detector circuit. To conduct the calibration, both the reference delay unit 710 and the delay unit to be calibrated (tunable delay unit 720) are triggered simultaneously by trigger input 730 and the outputs of the two delay units 710, 720 are used as the inputs to the D flip flop 740 (the inputs may be either way round). As in the previous example, the output 750 of the D flip flop 740 indicates the relative time order of the two inputs (i.e. which triggers first) and the tap-select 760 of the delay unit under calibration 720 can be adjusted accordingly until a match is obtained, thus ensuring as close as possible a match between the two delays. The tap select 770 of the reference delay unit 720 can be varied to select different reference timings.

By adding in suitable multiplexers, any number of delay units may be calibrated to the single calibrated delay unit 720 or to each other.

As can be seen, these tunable delay lines can be extremely useful in CTBV-style circuits. Two further applications of tunable delay lines will now be described, although these are not limiting on the scope of the invention. It will be appreciated that tunable delay lines find uses in numerous circuits.

EXAMPLE APPLICATION 3

Tunable Ranging for Impulse Radar

In impulse (gated) radar systems, a tunable delay is required for the ranging function. The radar system emits pulses and looks for echoes of those pulses reflected from objects within a certain range, i.e. within a certain time of the transmission. Because of the severe transmission power restrictions of the UWB spectrum, an individual reflected pulse can in some circumstances be hard to detect, so instead a large number of received pulses are generally averaged before the signal can be distinguished above the noise level.

The radar unit selects a particular sampling time in the received signal, a certain time after pulse transmission and corresponding to a particular target distance. The system repeatedly samples and averages the signal at that point in time to determine if pulses are being reflected at that target distance. The target distance being sampled (i.e. the point in time in the received signal) is determined by a delay unit placed between the transmitter and the sampler. In other words, the transmitted pulse (or the trigger used for pulse generation) is simultaneously passed through the delay unit and used as the trigger to start the received signal sampler. By varying the length of this delay, the sample is controlled to sample different points in time and therefore different distances.

By accurately programming the time between when the outgoing impulses are transmitted and the backscattered or reflected signal is sampled, the radar range can be set accurately. By varying the delay, objects can be detected at different distances. Electromagnetic waves travel at a speed close to light, thereby demanding highly accurate time adjustments in order to get accurate distance measurements. In a single sample radar system (i.e. one which only looks at a single target distance at a given time), the depth resolution is dependent on the fine-tuning of the ranging delay. For example, if the ranging delay is only known to within a few nanometers, then the distance is only known to within about a meter. For short-range radar systems, resolution requirements are really challenging. In long-range radar system, a distance accuracy to within a few meters may be considered highly accurate, but over short ranges, such as a few meters, a higher precision (i.e. cm or mm precision) becomes desirable. With the system described here, assuming $\tau_{min}$=20 ps, ranging may be tuned to about 3 mm precision.

Figure 8:
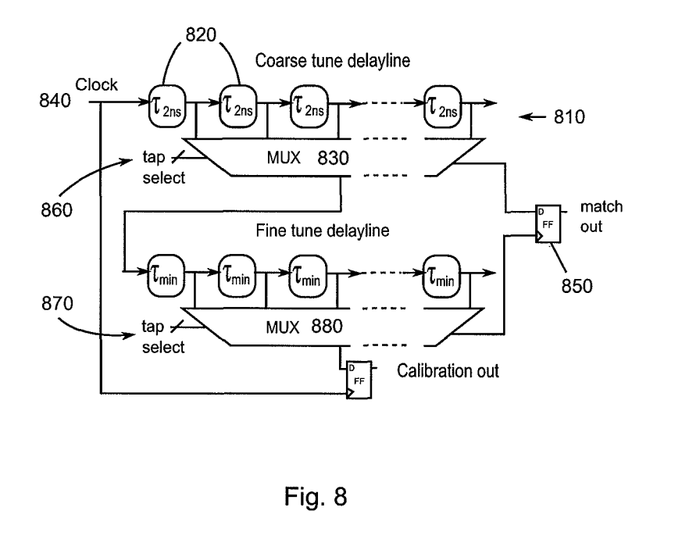
FIG. 8 shows a programmable delay element according to embodiments of the invention with coarse and fine tuning.

A programmable and calibrated delay element for quite accurate ranging might be implemented efficiently by combining coarse, tunable delays with $\tau_{min}$ delays. FIG. 8 shows an example of a tunable coarse delay line 810 with unit delays 820 of the order of 2 ns. These coarse unit delays 820 may be implemented with slow circuits for area efficiency. As in the previous examples, the overall delay can be tuned by selecting a varying number of these 2 ns delay elements using first multiplexer 830.

Unfortunately slow transitions increase production spread and make it even more difficult to design accurate delays. However, if all $\tau_{2ns}$ delays are intentionally made a little too short, then a programmable number of $\tau_{min}$ delays may be added to make up the shortfall to within an accuracy of $\tau_{min}$.

For calibration of this delay line, an accurate clock 840 matching the $\tau_{2ns}$ delay (i.e. 500 MHz) is used as a trigger, and the above calibration scheme using a D flip-flop 850 is applied. Calibration may be done against any integral number of clock periods. To calibrate an entire delay line, each coarse delay line tap is calibrated in turn. For example, first the coarse tap select 860 can be set to the first tap and the fine tap select 870 is then varied until the total combined delay output from second multiplexer 880 matches the 2 ns clock cycle. The fine tap select 870 is stored with the first coarse tap select 860. Next the coarse tap select 860 is set to the second tap and the fine tap select 870 is again varied until the total combined delay matches the two 2 ns clock cycles (i.e. total delay of 4 ns). This new fine tap select 870 is stored with the second coarse tap select 860. This procedure is continued for the whole delay line. After calibration each coarse delay tap setting is matched by a fine tune setting giving a calibrated result with $\tau_{min}$ resolution. Assuming $\tau_{min}=20$ ps, the 2 ns coarse tune delay line has been calibrated to within 1%. In other words, this arrangement provides a tunable delay line with tap selects separated by 2 ns+/−20 ps.

Alternatively, the coarse and fine tap tunable delay line shown in FIG. 8 can form a single delay element of a tunable delay line. This provides great versatility of accurate timings in a tunable delay line. It will be appreciated that further levels of refinement may be added, e.g. three or more levels of coarseness may be used.

EXAMPLE APPLICATION 4

Tunable Delay Line Matching Chip Rate in Symbol Detectors

As another example, the tunable unit-delay may be used in CTBV symbol detectors or cross-correlators 100 as shown in FIG. 1.

If it is desired to detect symbols with a chip-duration of 20 ns (i.e. 50 MHz chip clock), then the unit delays 140 of the delay line 130 in FIG. 1 must accurately match the 20 ns chip-duration in order to sample the incoming signal correctly. In fact 20 ns is a long delay compared with $\tau_{min}$ of say 20 ps and the accumulated deviations along the delay line will be significant. By using a tunable delay unit (e.g. as shown in FIG. 4 or FIG. 8) combined with a periodic signal (clock), a simple procedure may be applied for unit-delay adjustment as follows:

The symbol detector 100 of FIG. 1 is set up with the delay line 130 comprising tunable delay elements 140. The tunable delay elements 140 may be the delay unit 400 of FIG. 4. The detector 100 is also set up to use AND-correlation (i.e. operation 170, OP=AND gate) and a 50 MHz clock is supplied as the input. The counter threshold 195 is set to 2 (i.e. to detect a symbol if two '1's are correctly matched against the template) and for the first unit delay 140, the symbol template 160 is set to "11000000 . . . ".

The first unit delay 140 is then tuned. When the first delay element 140 is close enough to 20 ns, the detector 100 detects both '1's of the symbol in the received signal stream and the system will find "symbol detected". For example with the arrangement of FIG. 2A, the counter outputs a thermometer code with two '1's which matches the threshold 195 set previously. By increasing/decreasing the unit-delay 140, the minimum and maximum tuning settings for symbol detection can be determined. A tuning setting around midway between the maximum and minimum settings will give a unit-delay 140 close to 20 ns and will provide the best setting for tuning of the next unit-delay.

The procedure continues by moving a '1' to the right in the symbol template, e.g. "10100000 . . . " and repeating the procedure to calibrate the next delay element 140, by tuning the next delay element 140 until the symbol is detected. In this way all unit-delays are tuned to match the chip-rate clock. It should be noted that the accumulated errors introduced early in the delay line are accounted for by this sequential tuning procedure.

It will be appreciated that the above procedure is just one example of a tuning procedure and different logical operators 170 and symbol templates 160 could also be used to achieve the same goal.

The above embodiments may readily be combined together or used separately. For example, the tunable delay line and the thermometer/floating coded counter (FIGS. 2A and 2B) can each or both be used in the symbol detector or pulse detector 100 described above. Equally, these circuits are not tied to use in the symbol or pulse detectors and can be used in a large variety of other circuits and other applications. The above descriptions are provided merely as examples and the skilled person will readily selectively combine the various elements of the different embodiments as desired.

The invention claimed is:

1. A continuous time counter comprising:
   a plurality of counter inputs; and
   a plurality of adding stages, each adding stage comprising a stack of one or more outputs, and each counter input providing an input to an adding stage,
   wherein the adding stages are arranged successively from a first adding stage to a last adding stage,
   wherein the first adding stage is arranged to set its single output to a first output value,
   wherein each succeeding adding stage is arranged to take the outputs from the immediately preceding stage and when the appropriate counter input for the adding stage represents a count, the adding stage is arranged to add a new output at the bottom of the stack and when the counter input represents no count, the adding stage is arranged to add a new output at the top of the stack, and
   wherein the counter is arranged to apply a compensating delay to each of its inputs to compensate for the propagation delay through the adding stages.

2. A counter of claim 1, wherein the first adding stage takes its input from the first counter input and when the first counter input represents a count, the first adding stage is arranged to set its single output to represent a count and wherein when the first counter input represents no count, the first adding stage is arranged to set its single output to represent no count, and
   wherein in each succeeding adding stage, when the counter input represents a count, the adding stage is arranged to add a new output at the bottom of the stack representing a count, and when the counter input represents no count, the adding stage is arranged to add a new output at the top of the stack representing no count.

3. The counter of claim 1, wherein each adding stage comprises one or more switching elements for connecting the inputs to the outputs.

4. The counter of claim 3, wherein the switching elements are multiplexers each arranged to connect one of two neighbouring inputs to an output.

5. The counter of claim 3, wherein the switching elements are demultiplexers each arranged to connect an input to one of two neighbouring outputs.

6. The counter of claim 1, wherein the compensating delay is incorporated into the elements of the adding stages.

7. A method of continuous time counting comprising:
   taking a plurality of counter inputs; providing a plurality of adding stages each comprising a stack of one or more outputs, each counter input providing an input to an adding stage, wherein the adding stages are arranged successively from a first adding stage to a last adding stage;
   setting the single output of the first adding stage to an output value;
   for each succeeding adding stage, taking the outputs from the immediately preceding stage and when the appropriate counter input for the adding stage represents a count, adding a new output at the bottom of the stack and when the counter input represents no count, adding a new output at the top of the stack; and applying a compensating delay to each of the counter inputs to compensate for the propagation delay through the corresponding adding stage.

8. The method of claim 7, wherein the first adding stage takes its input from the first counter input and when the first counter input represents a count, the first adding stage sets its single output to represent a count and wherein when the first counter input represents no count, the first adding stage sets its single output to represent no count, and wherein in each succeeding adding stage, when the counter input represents a count, the adding stage adds a new output at the bottom of the stack representing a count, and when the counter input represents no count, the adding stage adds a new output at the top of the stack representing no count.

9. The method of claim 7, wherein each adding stage comprises one or more switching elements for connecting the inputs to the outputs.

10. The method of claim 9, wherein the switching elements are multiplexers each arranged to connect one of two neighbouring inputs to an output.

11. The method of claim 9, wherein the switching elements are demultiplexers each arranged to connect an input to one of two neighbouring outputs.

12. The method of claim 7, wherein the compensating delay is incorporated into the elements of the adding stages.

* * * * *